United States Patent
Kuo et al.

(10) Patent No.: US 12,424,989 B2
(45) Date of Patent: Sep. 23, 2025

(54) ELECTRONIC DEVICE AND METHOD FOR ENVELOPE TRACKING

(71) Applicant: MEDIATEK INC., Hsinchu (TW)

(72) Inventors: Ting-Hsun Kuo, Hsinchu (TW); Tsung-Pin Hu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 122 days.

(21) Appl. No.: 18/519,626

(22) Filed: Nov. 27, 2023

(65) Prior Publication Data
US 2024/0178805 A1 May 30, 2024

Related U.S. Application Data

(60) Provisional application No. 63/385,217, filed on Nov. 29, 2022.

(51) Int. Cl.
*H03F 3/24* (2006.01)
*H03F 1/32* (2006.01)
*H04B 1/04* (2006.01)
*H04L 25/03* (2006.01)

(52) U.S. Cl.
CPC ........... *H03F 3/245* (2013.01); *H03F 1/3258* (2013.01); *H04B 1/0475* (2013.01); *H04L 25/03847* (2013.01); *H03F 2200/451* (2013.01); *H04B 2001/0408* (2013.01)

(58) Field of Classification Search
CPC .. H03F 3/245; H03F 1/3258; H03F 2200/451; H03F 3/19; H04B 1/0475; H04B 2001/0408; H04L 25/03847
USPC .................. 375/219, 224, 295–297
See application file for complete search history.

(56) References Cited

U.S. PATENT DOCUMENTS

| | | | |
|---|---|---|---|
| 9,692,366 B2* | 6/2017 | Pilgram | H03F 3/24 |
| 9,729,255 B1* | 8/2017 | Rohdin | H04B 17/21 |
| 2016/0072530 A1* | 3/2016 | El-Hassan | H04B 1/0475 455/114.2 |
| 2017/0195972 A1* | 7/2017 | Drogi | H03F 3/191 |
| 2018/0234060 A1* | 8/2018 | Langer | H03G 3/3042 |
| 2020/0295713 A1* | 9/2020 | Khlat | H03M 1/12 |
| 2020/0336122 A1* | 10/2020 | Lin | H03F 1/0233 |
| 2020/0412391 A1* | 12/2020 | Belitzer | H03F 3/24 |
| 2023/0353098 A1* | 11/2023 | Henzler | H04B 1/0475 |
| 2025/0015769 A1* | 1/2025 | Cope | H03F 3/195 |

* cited by examiner

*Primary Examiner* — Emmanuel Bayard
(74) *Attorney, Agent, or Firm* — McClure, Qualey & Rodack, LLP

(57) ABSTRACT

An electronic device includes a processor, a modulator, and a power amplifier. The processor receives a baseband signal and executes a first ET shaping function on the baseband signal. The modulator receives the baseband signal, detects the magnitude of the baseband signal, and outputs the first voltage according to the magnitude of the baseband signal. The power amplifier outputs an amplified signal based on the first voltage. The first ET shaping function enables the relationship between the baseband signal and the first voltage to be $Vpa=a|X|^2+b$. X is the baseband signal, Vpa is the first voltage, and a and b are constants. The look-up table records the relation curve between the power of the amplified signal and the first voltage when the second ET shaping function is used for envelope tracking.

20 Claims, 5 Drawing Sheets

ELECTRONIC DEVICE AND METHOD FOR ENVELOPE TRACKING

CROSS REFERENCE TO RELATED APPLICATIONS

This application claims the benefit of U.S. Provisional Application No. 63/385,217, filed on Nov. 29, 2022, the entirety of which is incorporated by reference herein.

BACKGROUND OF THE INVENTION

Field of the Invention

The present invention relates to an electronic device, and, in particular, to an electronic device for envelope tracking.

Description of the Related Art

Envelope tracking (ET) is a promising technique to improve transmitting (TX) efficiency. However, compared with average power tracking (PET), ET usually introduces worse power supply noise and hence yields worse TX noise.

Generally, TX noise is equal to power amplifier (PA) noise plus power supply noise multiplied by the power supply rejection ratio. Under assumption of fixed power supply rejection ratio, it is important to improve upon the existing TX noise and provide an optimal design for an ET shaping function without additional degradation of the PA noise.

BRIEF SUMMARY OF THE INVENTION

An embodiment of the present invention provides an electronic device. The electronic device includes a processor, a modulator, and a power amplifier. The processor receives a baseband signal and executes a first ET shaping function on the baseband signal. The modulator is electrically connected to the processor, receives the baseband signal, detects the magnitude of the baseband signal, and outputs a first voltage according to the magnitude of the baseband signal. The power amplifier is electrically connected to the modulator, and outputs an amplified signal based on the first voltage. The first ET shaping function enables the relationship between the baseband signal and the first voltage to be $Vpa=a|X|2+b$. X is the baseband signal, Vpa is the first voltage, and a and b are constants. The processor calculates the constants a and b based on a look-up table. The look-up table records the relation curve between the power of the amplified signal and the first voltage when the second ET shaping function is used for envelope tracking.

According to the electronic device described above, the processor selects a first point and a second point on the relation curve in the look-up table. The first point corresponds to the average power of the amplified signal. The second point corresponds to the maximum power of the amplified signal.

According to the electronic device described above, the processor calculates the constants a and b based on the first point and the second point.

According to the electronic device described above, the first point corresponds to the root-mean-square of the first voltage, and the second point corresponds to the maximum of the first voltage.

According to the electronic device described above, when the first ET shaping function is the same as the second ET shaping function, the first ET shaping function enables the relationship between the baseband signal and the first voltage to be $Vpa=a|X|+b$.

According to the electronic device described above, the second ET shaping function is an Iso-gain algorithm.

According to the electronic device described above, the processor executes a Digital Pre-Distortion (DPD) function on the baseband signal to compensate for the non-linearity of the power amplifier.

The electronic device further includes a transmitting RF circuit. The transmitting RF circuit is electrically connected to the power amplifier, and loads the baseband signal on a carrier to generate an RF signal.

According to the electronic device described above, the power amplifier receives the RF signal from the transmitting RF circuit, and amplifies the RF signal based on the first voltage to output the amplified signal.

According to the electronic device described above, the processor executes the first ET shaping function on the baseband signal to reduce the power supply noise on the first voltage.

According to the electronic device described above, the processor calculates the constants a and b based on the look-up table to avoid saturation of the power amplifier and enable the DPD function to compensate the non-linearity of the power amplifier.

An embodiment of the present invention also provides a method for envelope tracking (ET). The method is applied to an electronic device having a processor, a modulator, and a power amplifier. The method includes the following steps. The processor receives a baseband signal. The processor executes a first ET shaping function on the baseband signal. The first ET shaping function enables the relationship between the baseband signal and a first voltage from the modulator to be $Vpa=a|X|^2+b$. X is the baseband signal, Vpa is the first voltage, and a and b are constants. The processor calculates the constants a and b based on a look-up table. The modulator receives the baseband signal after the first ET shaping function is executed on the baseband signal. The modulator detects the magnitude of the baseband signal. The modulator outputs the first voltage according to the magnitude of the baseband signal. The look-up table records the relation curve between the power of the amplified signal and the first voltage when the second ET shaping function is used for envelope tracking.

According to the method described above, the step of the processor calculating the constants a and b based on the look-up table includes the following steps. The processor selects a first point and a second point on the relation curve in the look-up table. The first point corresponds to the average power of the amplified signal, and the second point corresponds to the maximum power of the amplified signal.

According to the method described above, the step of the processor calculating the constants a and b based on the look-up table includes the following steps. The processor calculates the constants a and b based on the first point and the second point.

According to the method described above, the first point corresponds to the root-mean-square of the first voltage, and the second point corresponds to the maximum of the first voltage.

The method further includes the following steps. The processor executes the first ET shaping function to enable the relationship between the baseband signal and the first voltage to be $Vpa=a|X|+b$ when the first ET shaping function is the same as the second ET shaping function.

According to the method described above, the second ET shaping function is an Iso-gain algorithm.

The method further includes the following step. The processor executes a Digital Pre-Distortion (DPD) function on the baseband signal to compensate for the non-linearity of the power amplifier.

The electronic device has a transmitting RF circuit. The method further includes the following step. The transmitting RF circuit loads the baseband signal on a carrier to generate an RF signal.

The method further includes the following steps. The power amplifier receives the RF signal from the transmitting RF circuit. The power amplifier amplifies the RF signal based on the first voltage to output the amplified signal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
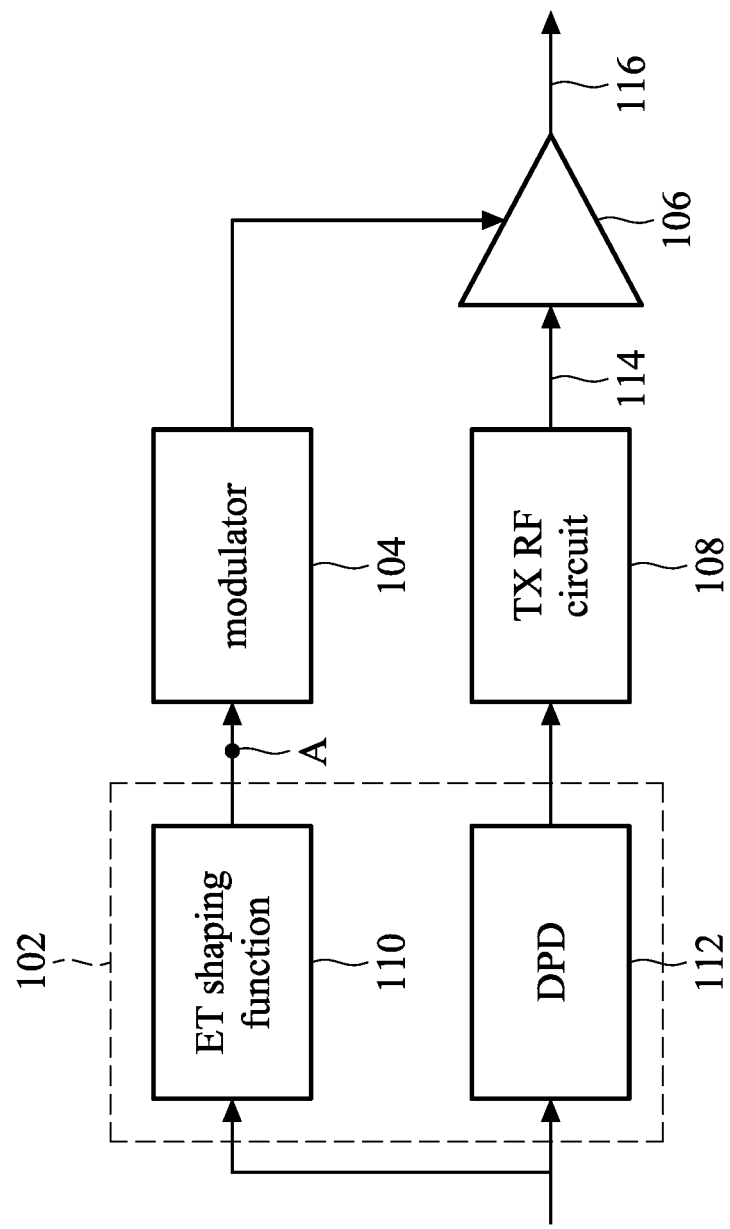
FIG. 1 is a schematic diagram of an electronic device 100 in accordance with some embodiments of the present invention.

In order to make the above purposes, features, and advantages of some embodiments of the present invention more comprehensible, the following is a detailed description in conjunction with the accompanying drawing.

Certain terms are used throughout the description and following claims to refer to particular components. As one skilled in the art will understand, electronic equipment manufacturers may refer to a component by different names. This document does not intend to distinguish between components that differ in name but not function. It is understood that the words "comprise", "have" and "include" are used in an open-ended fashion, and thus should be interpreted to mean "include, but not limited to . . . ". Thus, when the terms "comprise", "have" and/or "include" used in the present invention are used to indicate the existence of specific technical features, values, method steps, operations, units and/or components. However, it does not exclude the possibility that more technical features, numerical values, method steps, work processes, units, components, or any combination of the above can be added.

The directional terms used throughout the description and following claims, such as: "on", "up", "above", "down", "below", "front", "rear", "back", "left", "right", etc., are only directions referring to the drawings. Therefore, the directional terms are used for explaining and not used for limiting the present invention. Regarding the drawings, the drawings show the general characteristics of methods, structures, and/or materials used in specific embodiments. However, the drawings should not be construed as defining or limiting the scope or properties encompassed by these embodiments. For example, for clarity, the relative size, thickness, and position of each layer, each area, and/or each structure may be reduced or enlarged.

When the corresponding component such as layer or area is referred to as being "on another component", it may be directly on this other component, or other components may exist between them. On the other hand, when the component is referred to as being "directly on another component (or the variant thereof)", there is no component between them. Furthermore, when the corresponding component is referred to as being "on another component", the corresponding component and the other component have a disposition relationship along a top-view/vertical direction, the corresponding component may be below or above the other component, and the disposition relationship along the top-view/vertical direction is determined by the orientation of the device.

It should be understood that when a component or layer is referred to as being "connected to" another component or layer, it can be directly connected to this other component or layer, or intervening components or layers may be present. In contrast, when a component is referred to as being "directly connected to" another component or layer, there are no intervening components or layers present.

The electrical connection or coupling described in this disclosure may refer to direct connection or indirect connection. In the case of direct connection, the endpoints of the components on the two circuits are directly connected or connected to each other by a conductor line segment, while in the case of indirect connection, there are switches, diodes, capacitors, inductors, resistors, other suitable components, or a combination of the above components between the endpoints of the components on the two circuits, but the intermediate component is not limited thereto.

The words "first", "second", "third", "fourth", "fifth", and "sixth" are used to describe components. They are not used to indicate the priority order of or advance relationship, but only to distinguish components with the same name.

It should be noted that the technical features in different embodiments described in the following can be replaced, recombined, or mixed with one another to constitute another embodiment without departing from the spirit of the present invention.

FIG. 1 is a schematic diagram of an electronic device 100 in accordance with some embodiments of the present invention. As shown in FIG. 1, the electronic device 100 includes a processor 102, a modulator 104, a power amplifier 106, and a transmitting (TX) radio frequency (RF) circuit 108. In some embodiments, the electronic device 100 may be a smart phone, a wearable device, or a tablet, but the present invention is not limited thereto. The processor 102 and the TX RF circuit 108 are combined in a modem, but the present invention is not limited thereto. The processor 102 receives a baseband signal X and executes a first ET shaping function 110 on the baseband signal X. In detail, the processor 102 executes the first ET shaping function 110 on the baseband signal X to reduce the power supply noise on the first voltage Vpa. In some embodiments, the modulator 104 is an envelope tracking (ET) modulator, and is combined in a power management integrated circuit (PMIC), but the present invention is not limited thereto. The modulator 104 is electrically connected to the processor 102, receives the baseband signal X, detects the magnitude of the baseband signal X, and outputs a first voltage Vpa according to the magnitude of the baseband signal X.

In some embodiments, the first ET shaping function 110 enables the relationship between the baseband signal and the first voltage to be Vpa=a|X|$^2$+b, X is the baseband signal, Vpa is the first voltage, and a and b are constants. The power amplifier 106 is electrically connected to the modulator 104, and outputs an amplified signal 116 based on the first voltage Vpa. The power amplifier 106 has a gain varied with the first voltage Vpa. In some embodiments, the processor 102 calculates the constants a and b based on a look-up table. The look-up table is an Iso-gain look-up table and records the relation curve between the power of the amplified signal 116 and the first voltage Vpa when the second ET shaping function is used for envelope tracking. That is, the second ET shaping function is an Iso-gain algorithm in the prior art. When the first ET shaping function 110 is the same as the second ET shaping function, for example, the Iso-gain algorithm, the first ET shaping function 110 enables the relationship between the baseband signal X and the first voltage Vpa to be Vpa=a|X|+b.

The processor 102 selects a first point and a second point on the relation curve in the look-up table. The first point corresponds to the average power of the amplified signal 116, and the second point corresponds to the maximum power of the amplified signal 116. In some embodiments, the first point corresponds to the root-mean-square of the first voltage Vpa, and the second point corresponds to the maximum of the first voltage Vpa. In detail, since the first ET shaping function 110 enables the relationship between the baseband signal X and the first voltage Vpa to be Vpa=a|X|$^2$+b, the constants a and b need to be calculated. The two unknowns (for example, constants a and b) in the function Vpa=a|X|$^2$+b need to be solved by the two points (for example, the first point and the second point selected by the processor 102) on a line. That is, the processor 102 calculates the constants a and b based on the first point and the second point.

In some embodiments, the processor 102 executes a Digital Pre-Distortion (DPD) function 112 on the baseband signal X to compensate for the non-linearity of the power amplifier 106. The TX RF circuit 108 is electrically connected to the power amplifier 106 and loads the baseband signal X on a carrier to generate an RF signal 114. The power amplifier 106 receives the RF signal 114 from the TX RF circuit 108, and amplifies the RF signal 108 based on the first voltage Vpa to output the amplified signal 116. In some embodiments, the amplified signal 116 is sent an RF front-end circuit (not shown) for filtering or other subsequent processing, but the present invention is not limited thereto.

Figure 2:
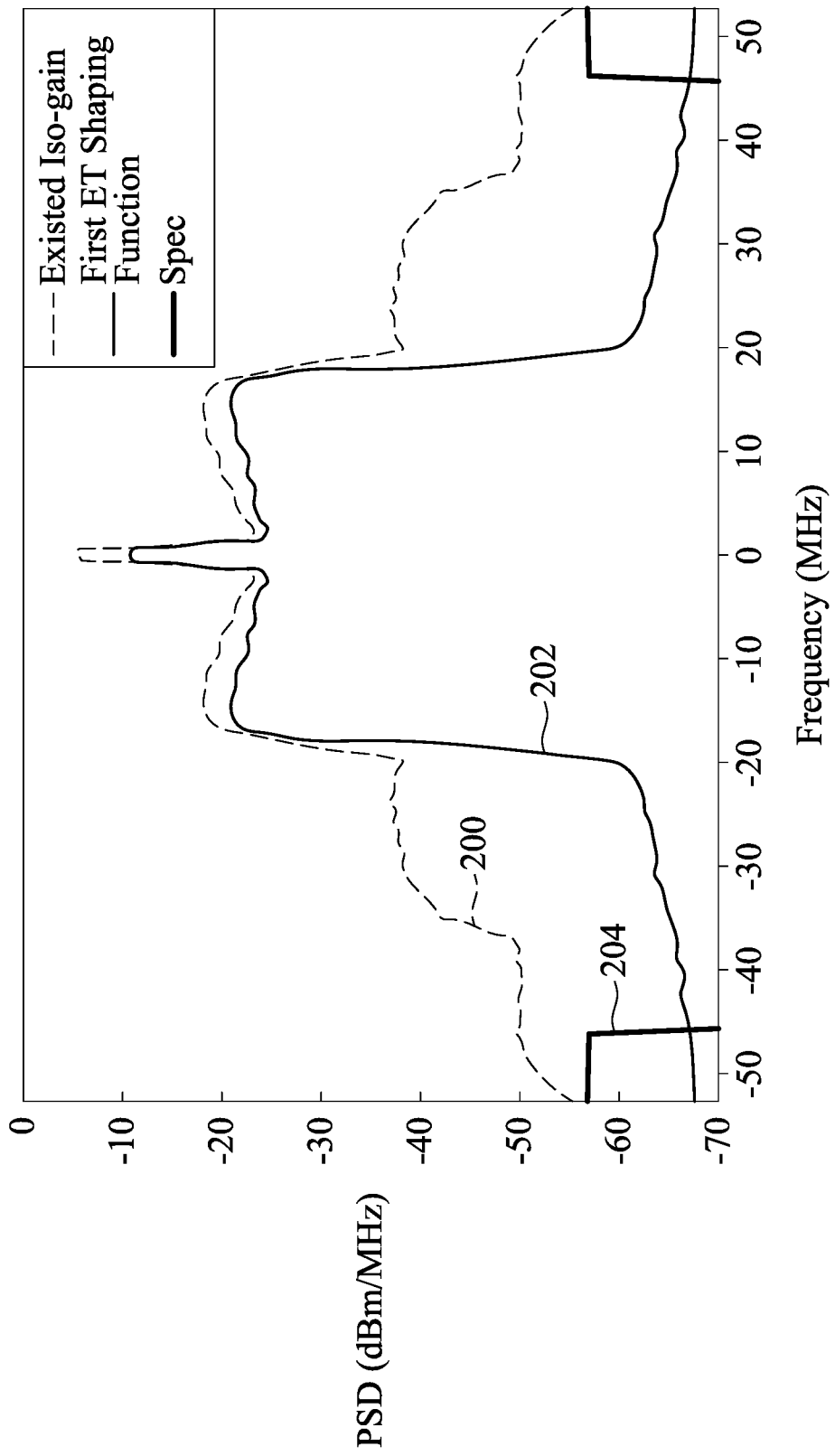
FIG. 2 is spectrum diagrams of a baseband signal output from a processor 102 by applying an existing Iso-gain algorithm and a first envelope tracking (ET) shaping function at a node A in FIG. 1 in accordance with some embodiments of the present invention.

FIG. 2 is spectrum diagrams of a baseband signal output from a processor 102 by applying an existing Iso-gain algorithm and a first envelope tracking (ET) shaping function at a node A in FIG. 1 in accordance with some embodiments of the present invention. The horizontal axis in FIG. 2 is frequency in MHz, and the vertical axis in FIG. 2 is power spectral density (PSD) in dBm/MHz. As shown in FIG. 2, a spectrum curve 200 is the spectrum curve of the baseband signal X from the processor 102 by applying the existing Iso-gain algorithm at the node A. A spectrum curve 202 is the spectrum curve of the baseband signal X from the processor 102 by applying the first envelope tracking (ET) shaping function at the node A. A spectrum curve 204 is the specification for certification. The spectrum curve 200 is higher than the spectrum curve 204 at less than −45 MHz and more than +45 MHz, thus the spectrum curve 200 does not meet the specification for certification. On the other hand, the spectrum curve 202 is lower than the spectrum curve 204 at less than −45 MHz and more than +45 MHz, thus the spectrum curve 202 meets the specification for certification.

As shown in FIG. 2, the PSD of the sideband of the spectrum curve 200 may be higher than that of the sideband of the spectrum curve 202. Therefore, the spectrum curve 202 by applying the first envelope tracking (ET) shaping function may reduce the signal bandwidth of the baseband signal X and improve power supply noise, that is, the noise on the first voltage Vpa. For the spectrum curve 200, the relationship between the baseband signal X and the first voltage Vpa may be Vpa=a|X|+b. Therefore, the relationship between the magnitude of the baseband signal X and the power of the baseband signal X may be $|X|=\sqrt{I^2+Q^2}=c_0+c_1P^1+c_2P^2+c_3P^3+\ldots$, wherein $P=I^2+Q^2$. I is the real part of the baseband signal X, and Q is the imaginary part of the baseband signal X. On the other hand, for the spectrum curve 202, the relationship between the baseband signal X and the first voltage Vpa may be Vpa=a|X|$^2$+b. Therefore, the relationship between the magnitude of the baseband signal X and the power of the baseband signal X may be |X|$^2$=I$^2$+Q$^2$, wherein P=I$^2$+Q$^2$. Due to the above-mentioned expression, the power of the spectrum curve 202 may be concentrated between +/−20 HMz, but the power of the spectrum curve 200 is spread across frequencies, so that the sideband of the spectrum curve 202 is lower than that of the spectrum curve 200.

Figure 3:
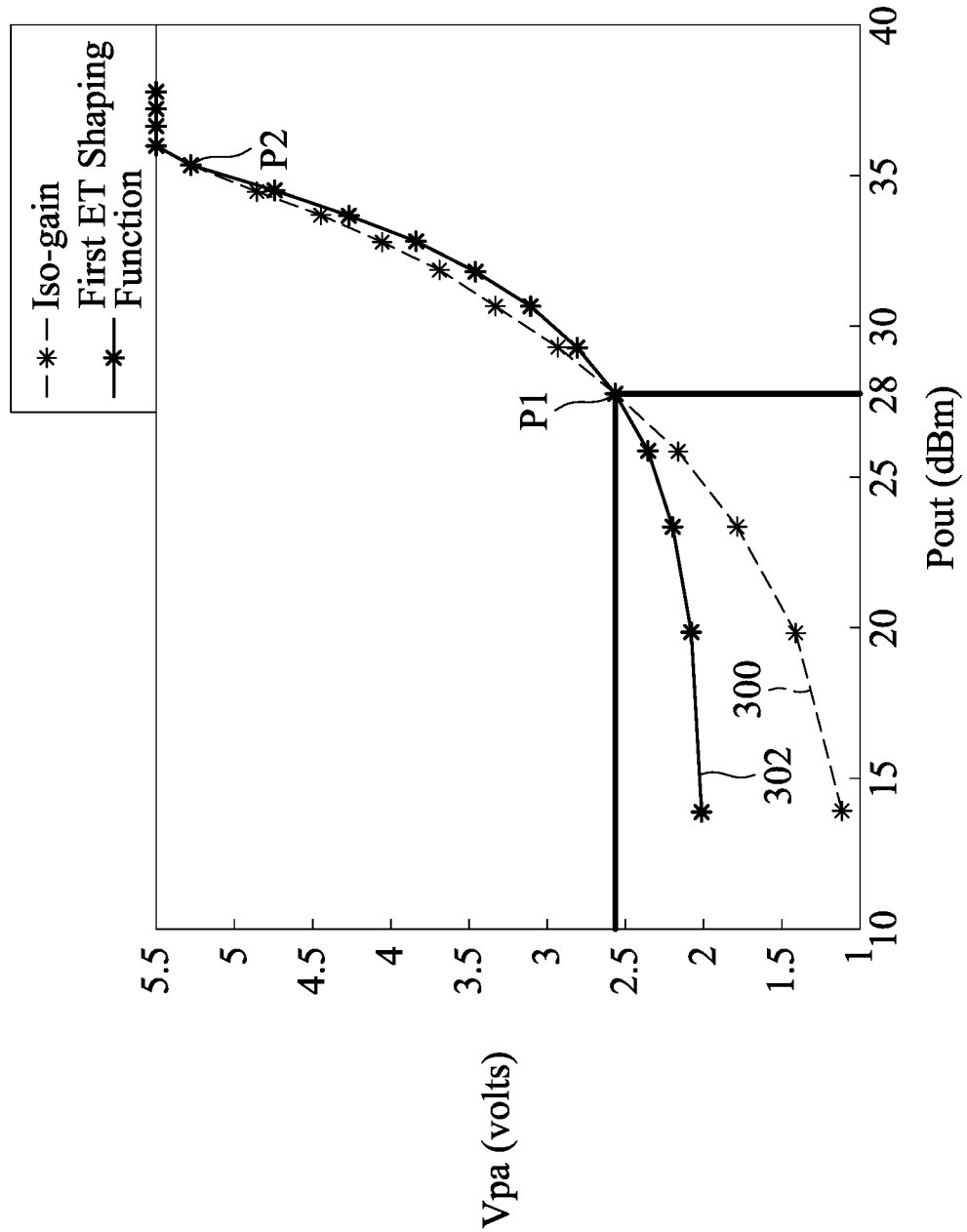
FIG. 3 is relation curves between output power of an amplified signal output from a power amplifier 106 and a first voltage from a modulator 104 by applying the existing Iso-gain algorithm and the first ET shaping function in accordance with some embodiments of the present invention.

FIG. 3 is relation curves between output power of an amplified signal output from a power amplifier 106 and a first voltage from a modulator 104 by applying the existing Iso-gain algorithm and the first ET shaping function 110 in accordance with some embodiments of the present invention. The horizontal axis in FIG. 3 is the power of the amplified signal 116 in dBm, and the vertical axis in FIG. 3 is the first voltage Vpa in volts. As shown in FIG. 3, relation curve 300 is the relation curve between the power of the amplified signal 116 output from the power amplifier 106 and the first voltage Vpa from the modulator 104 by applying the existing Iso-gain algorithm. The relation curve 302 is the relation curve between the power of the amplified signal 116 output from the power amplifier 106 and the first voltage Vpa from the modulator 104 by applying the first ET shaping function 110. In some embodiments, the relation curve 300 is stored in a look-up table, for example, in a memory (not shown) in the electronic device 100. In some embodiments of FIG. 3, the target power of the amplified signal 116 may be 28 dBm, but the present invention is not limited thereto.

In some embodiments, the processor 102 executes the first ET shaping function 110 to select a point P1 and a point P2 on the relation curve 300. That is, the points P1 and P2 are intersection points between the relation curve 300 and the relation curve 302. In some embodiments, the point P1 corresponds to the average power of the amplified signal 116, and the point P2 corresponds to the maximum power of the amplified signal 116. In some embodiments, the point P2 may be obtained from the point P1 based on a peak-to-average power ratio (PAPR), but the present invention is not limited thereto. For example, the point P2 may be obtained by the point P1 plus the PAPR.

In some embodiments, the point P1 corresponds to the root-mean-square of the first voltage Vpa, and the point P2 corresponds to the maximum of the first voltage Vpa. Then, the processor 102 calculates the constants a and b in the expression Vpa=a|X|²+b based on the power values and the voltage values at points P1 and P2. For example, at the point P1, the average power of the amplified signal 116 is equal to 28 dBm, the root-mean-square of the first voltage Vpa is equal to 2.6V. At the point P2, the maximum power of the amplified signal 116 is equal to 36 dBm, and the root-mean-square of the first voltage Vpa is equal to 5.3V.

Therefore, 28 dBm and 2.6V for point P1 and 36 dBm and 5.3V for point P2 are substituted into the expression Vpa=a|X|²+b. That is, |X|² is substituted by 28 dBm, and Vpa is substituted by 2.6V, and |X|² is substituted by 36 dBm, and Vpa is substituted by 5.3V, so that the constants a and b in the expression Vpa=a|X|²+b can be calculated. After a and b are calculated based on points P1 and P2, the first ET shaping function 110 can be fully defined. The processor 102 calculates the constants a and b based on the look-up table to avoid saturation of the power amplifier 106 and enables the DPD function 112 to compensate for the non-linearity of the power amplifier 106.

Figure 4:
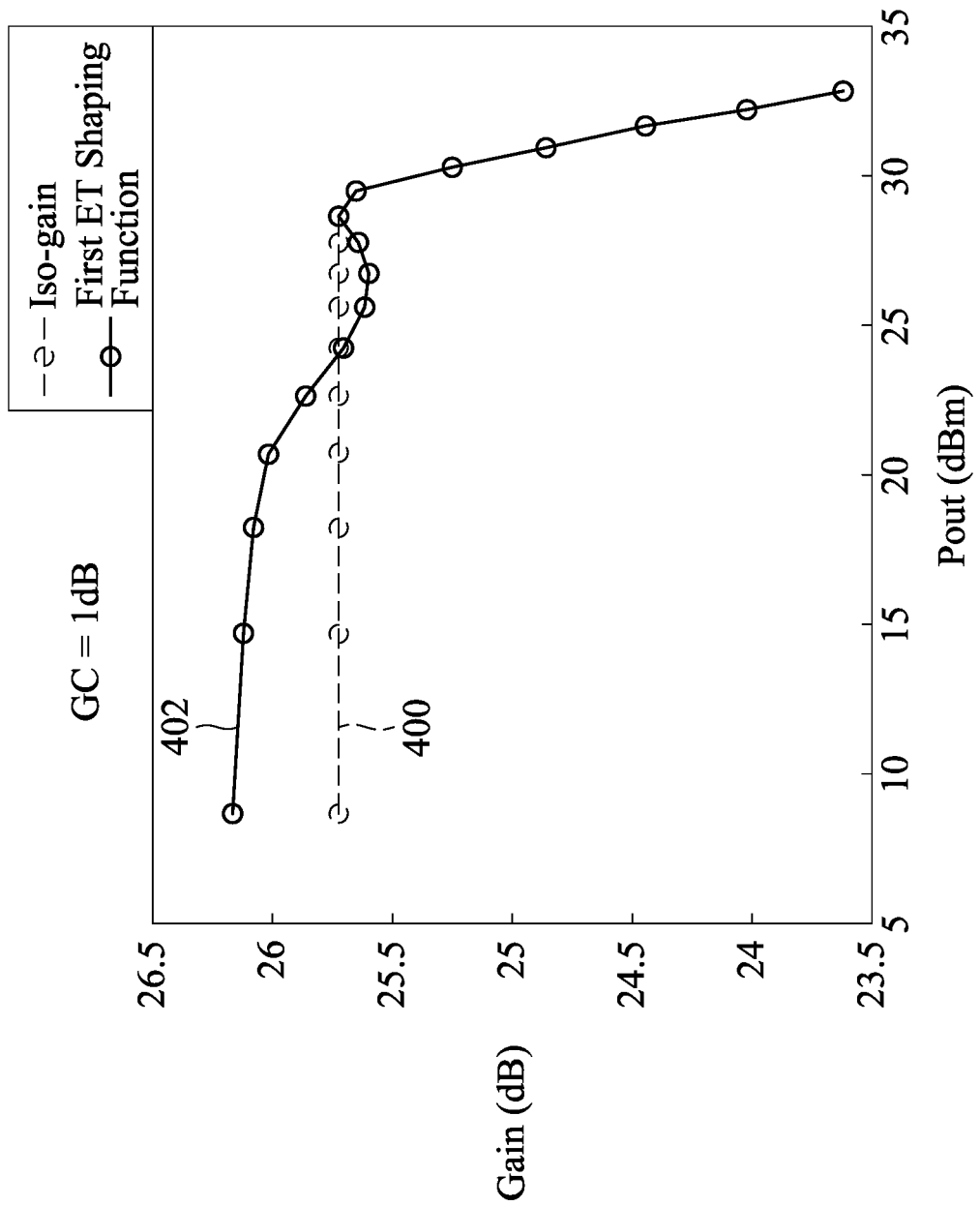
FIG. 4 is relation curves between the output power of the amplified signal output from the power amplifier 106 and a gain of the power amplifier 106 by applying the existing Iso-gain algorithm and the first ET shaping function in accordance with some embodiments of the present invention.

FIG. 4 is relation curves between the output power of the amplified signal output from the power amplifier 106 and a gain of the power amplifier 106 by applying the existing Iso-gain algorithm and the first ET shaping function 110 in accordance with some embodiments of the present invention. The horizontal axis in FIG. 4 is the power of the amplified signal 116 in dBm, and the vertical axis in FIG. 4 is the gain of the power amplifier 106 in dB. As shown in FIG. 4, relation curve 400 is the relation curve between the output power of the amplified signal 116 output from the power amplifier 106 and the gain of the power amplifier 106 by applying the existing Iso-gain algorithm. The relation curve 402 is the relation curve between the output power of the amplified signal 116 output from the power amplifier 106 and the gain of the power amplifier 106 by applying the first ET shaping function 110.

As shown in FIG. 4, even if the linearity of relation curve 402 is poorer than that of the relation curve 400, the processor 102 may execute the DPD function 112 to compensate for the non-linearity of the power amplifier 106. In detail, the processor 102 calculates the constants a and b in the expression Vpa=a|X|²+b based on the look-up table to avoid saturation of the power amplifier 106 and enables the DPD function 112 to compensate for the non-linearity of the power amplifier 106. In some embodiments, the first ET shaping function 110 is a modified power envelope tracking (PET) algorithm, but the present invention is not limited thereto.

Figure 5:
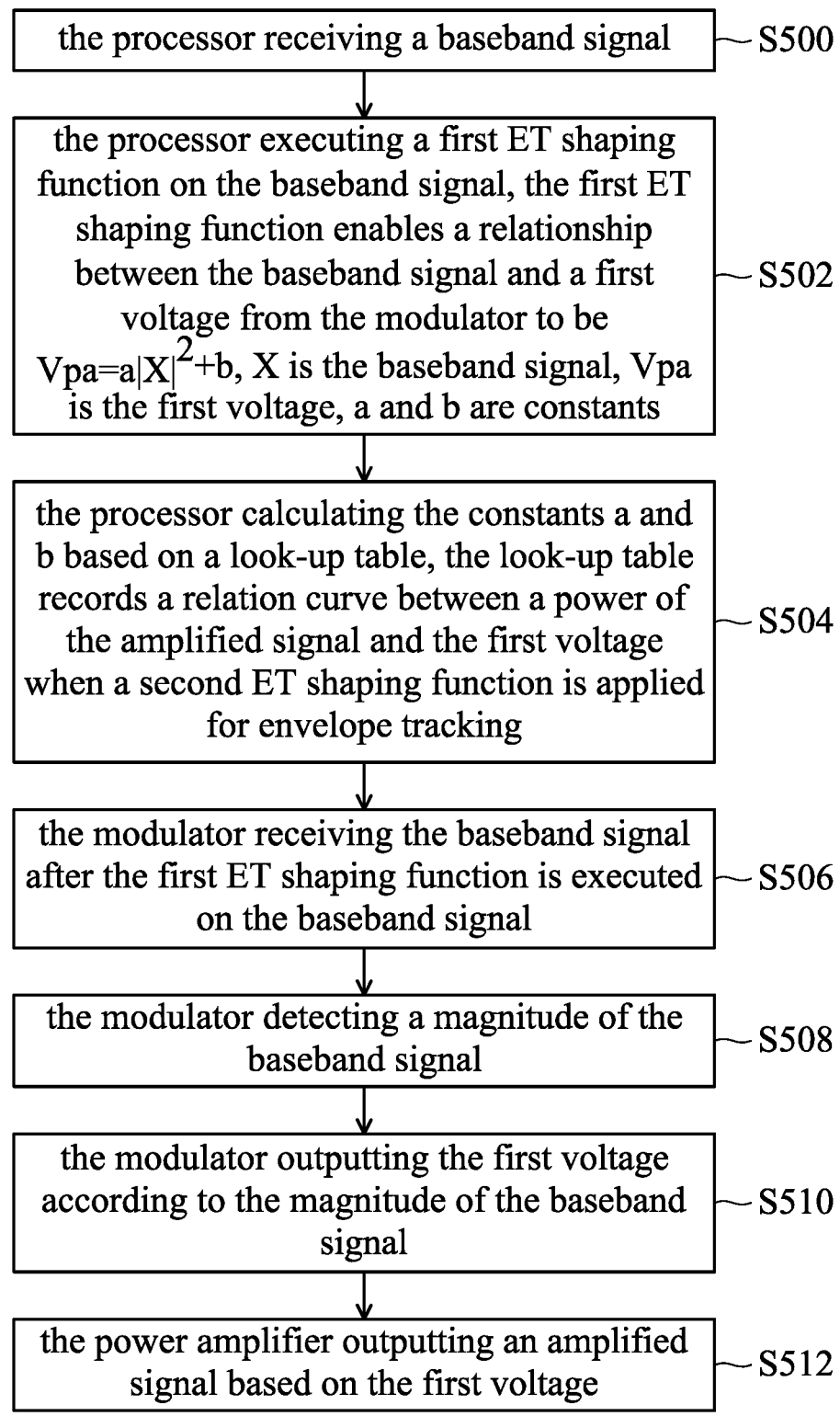
FIG. 5 is a flow chart of a method for ET in accordance with some embodiments of the present invention.

FIG. 5 is a flow chart of a method for ET in accordance with some embodiments of the present invention. The method for ET in FIG. 5 is applied to an electronic device having a processor, a modulator, and a power amplifier. For example, the method in FIG. 5 is applied to the electronic device 100 having the processor 102, the modulator 104, and the power amplifier 106 in FIG. 1, but the present invention is not limited thereto. The method includes the following steps. The processor receives a baseband signal (for example, baseband signal X in FIG. 1) (step S500). The processor executes a first ET shaping function (for example, the first ET shaping function 110 in FIG. 1) on the baseband signal. The first ET shaping function enables the relationship between the baseband signal and a first voltage (for example, the first voltage Vpa in FIG. 1) from the modulator to be Vpa=a|X|²+b. X is the baseband signal, Vpa is the first voltage, and a and b are constants (step S502).

The processor calculates the constants a and b based on a look-up table. The look-up table records the relation curve (for example, relation curve 300 in FIG. 3) between the power of an amplified signal (for example, amplified signal 116 in FIG. 1) and the first voltage when the second ET shaping function is used for envelope tracking (step S504). The modulator receives the baseband signal after the first ET shaping function is executed on the baseband signal (step S506). The modulator detects the magnitude of the baseband signal (step S508). The modulator outputs the first voltage according to the magnitude of the baseband signal (step S510). The power amplifier outputs the amplified signal based on the first voltage (step S512).

In some embodiments, steps S500, S502, and S504 may be executed by the processor 102 in FIG. 1. Steps 506, 508, and 510 may be executed by the modulator 104 in FIG. 1. Step S512 may be executed by the power amplifier 106 in FIG. 1. In some embodiments of step S504, the processor selects a first point (for example, point P1 in FIG. 3) and a second point (for example, point P2 in FIG. 3) on the relation curve (for example, relation curve 300 in FIG. 3) in the look-up table. In some embodiments, the first point corresponds to the average power of the amplified signal, and the second point corresponds to the maximum power of the amplified signal. In some embodiments, the first point corresponds to the root-mean-square of the first voltage, and the second point corresponds to the maximum of the first voltage.

In some embodiments, the processor further executes the first ET shaping function to enable the relationship between the baseband signal and the first voltage to be Vpa=a|X|+b when the first ET shaping function is the same as the second ET shaping function. The second ET shaping function is an Iso-gain algorithm.

In some embodiments, the processor executes a Digital Pre-Distortion (DPD) function (for example, DPD 112 in FIG. 1) on the baseband signal to compensate for the non-linearity of the power amplifier. In some embodiments, the electronic device further includes a transmitting RF circuit (for example, TX RF circuit 108 in FIG. 1). The transmitting RF circuit loads the baseband signal on a carrier to generate an RF signal (for example, RF signal 114 in FIG. 1). In some embodiments of step S512, the power amplifier first receives the RF signal from the transmitting RF circuit. Then, the power amplifier amplifies the RF signal based on the first voltage to output the amplified signal.

The modified power envelope tracking (PET) algorithm, that is, the first ET shaping function 110, executed by the processor 102 of the present invention leverages benefit of the Iso-gain algorithm and the traditional PET algorithm to not only reduce ET power supply leakage but also avoid PA saturation.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device for envelope tracking (ET), comprising:
   a processor, configured to receive a baseband signal and execute a first ET shaping function on the baseband signal;
   a modulator, electrically connected to the processor, configured to receive the baseband signal, detect a magnitude of the baseband signal, and output a first voltage according to the magnitude of the baseband signal; and a power amplifier, electrically connected to the modulator, configured to output an amplified signal based on the first voltage;

wherein the first ET shaping function enables that the first voltage is equal to an absolute value squared of the baseband signal multiplied by a first constant plus a second constant;

wherein the processor calculates the first and second constants based on a look-up table;

wherein the look-up table records a relation curve between a power of the amplified signal and the first voltage when a second ET shaping function is used for envelope tracking.

2. The electronic device as claimed in claim 1, wherein the processor selects a first point and a second point on the relation curve in the look-up table, wherein the first point corresponds to an average power of the amplified signal, and the second point corresponds to a maximum power of the amplified signal.

3. The electronic device as claimed in claim 2, wherein the processor calculates the first and second constants based on the first point and the second point.

4. The electronic device as claimed in claim 2, wherein the first point corresponds to a root-mean-square of the first voltage, and the second point corresponds to a maximum of the first voltage.

5. The electronic device as claimed in claim 1, wherein when the first ET shaping function is the same as the second ET shaping function, the first ET shaping function enables the relationship between the baseband signal and the first voltage to be Vpa=a|X|+b.

6. The electronic device as claimed in claim 1, wherein the second ET shaping function is an Iso-gain algorithm.

7. The electronic device as claimed in claim 1, wherein the processor executes a Digital Pre-Distortion (DPD) function on the baseband signal to compensate for the non-linearity of the power amplifier.

8. The electronic device as claimed in claim 7, further comprising:

a transmitting RF circuit, electrically connected to the power amplifier, configured to load the baseband signal on a carrier to generate an RF signal.

9. The electronic device as claimed in claim 8, wherein the power amplifier receives the RF signal from the transmitting RF circuit, and amplifies the RF signal based on the first voltage to output the amplified signal.

10. The electronic device as claimed in claim 1, wherein the processor executes the first ET shaping function on the baseband signal to reduce a power supply noise on the first voltage.

11. The electronic device as claimed in claim 7, wherein the processor calculates the first and second constants based on the look-up table to avoid saturation of the power amplifier and enable the DPD function to compensate for the non-linearity of the power amplifier.

12. A method for envelope tracking (ET), applied to an electronic device having a processor, a modulator, and a power amplifier, comprising:

the processor receiving a baseband signal;

the processor executing a first ET shaping function on the baseband signal; wherein the first ET shaping function enables that a first voltage from the modulator is equal to an absolute value squared of the baseband signal multiplied by a first constant plus a second constant;

the processor calculating the first and second constants based on a look-up table;

the modulator receiving the baseband signal after the first ET shaping function is executed on the baseband signal;

the modulator detecting the magnitude of the baseband signal;

the modulator outputting the first voltage according to the magnitude of the baseband signal; and the power amplifier outputting an amplified signal based on the first voltage;

wherein the look-up table records a relation curve between the power of the amplified signal and the first voltage when the second ET shaping function is used for envelope tracking.

13. The method as claimed in claim 12, wherein the step of the processor calculating the first and second constants based on the look-up table comprises:

the processor selecting a first point and a second point on the relation curve in the look-up table;

wherein the first point corresponds to the average power of the amplified signal, and the second point corresponds to the maximum power of the amplified signal.

14. The method as claimed in claim 13, wherein the step of the processor calculating the first and second constants based on the look-up table comprises:

the processor calculating the first and second constants based on the first point and the second point.

15. The method as claimed in claim 13, wherein the first point corresponds to the root-mean-square of the first voltage, and the second point corresponds to the maximum of the first voltage.

16. The method as claimed in claim 12, further comprising:

the processor executing the first ET shaping function to enable the relationship between the baseband signal and the first voltage to be Vpa=a|X|+b when the first ET shaping function is the same as the second ET shaping function.

17. The method as claimed in claim 12, wherein the second ET shaping function is an Iso-gain algorithm.

18. The method as claimed in claim 12, further comprising:

the processor executing a Digital Pre-Distortion (DPD) function on the baseband signal to compensate for the non-linearity of the power amplifier.

19. The method as claimed in claim 12, wherein the electronic device has a transmitting RF circuit; and the method further comprises:

the transmitting RF circuit loading the baseband signal on a carrier to generate an RF signal.

20. The method as claimed in claim 18, further comprising:

the power amplifier receiving the RF signal from the transmitting RF circuit; and the power amplifier amplifying the RF signal based on the first voltage to output the amplified signal.

* * * * *